United States Patent
Yeh et al.

(10) Patent No.: US 6,727,166 B1
(45) Date of Patent: Apr. 27, 2004

(54) REMOVAL OF SILICON OXYNITRIDE MATERIAL USING A WET CHEMICAL PROCESS AFTER GATE ETCH PROCESSING

(75) Inventors: Edward Yeh, San Jose, CA (US); Olivier Laparra, San Jose, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 285 days.

(21) Appl. No.: 09/441,899

(22) Filed: Nov. 17, 1999

(51) Int. Cl.[7] ............... H01L 21/3205; H01L 21/4763; H01L 21/44
(52) U.S. Cl. ............. 438/592; 438/630; 438/636; 438/651; 438/655; 438/683; 438/685
(58) Field of Search ................. 257/324; 216/96, 216/99, 664; 438/592, 786, 636, 651, 655, 682, 630, 683, 685

(56) References Cited

U.S. PATENT DOCUMENTS

| | | | | |
|---|---|---|---|---|
| 5,413,953 A | * | 5/1995 | Chein et al. | 437/69 |
| 5,702,869 A | * | 12/1997 | Chein et al. | 430/313 |
| 5,883,011 A | * | 3/1999 | Lin et al. | 438/747 |
| 5,891,784 A | * | 4/1999 | Cheung et al. | 438/303 |
| 5,902,125 A | * | 5/1999 | Wu | 438/300 |
| 6,004,850 A | * | 12/1999 | Lucas et al. | 438/401 |
| 6,030,541 A | * | 2/2000 | Adkisson et al. | 216/51 |
| 6,063,704 A | * | 5/2000 | Demirlioglu | 438/664 |

* cited by examiner

Primary Examiner—Wael Fahmy
Assistant Examiner—Shrinivas H Rao
(74) Attorney, Agent, or Firm—Peter Zawilski

(57) ABSTRACT

A method is presented for forming a transistor gate structure. A gate oxide layer is formed. Gate material is deposited on the gate oxide layer. A layer of silicon oxynitride is deposited on the gate material. The layer of silicon oxynitride, the gate material and the gate oxide layer are etched to form a gate structure. A silicon oxynitride region remains on top of the gate structure. A wet chemical process is performed to remove the silicon oxynitride region from the top of the gate structure. After performing the wet chemical process, spacers are formed around the gate structure.

20 Claims, 4 Drawing Sheets

REMOVAL OF SILICON OXYNITRIDE MATERIAL USING A WET CHEMICAL PROCESS AFTER GATE ETCH PROCESSING

BACKGROUND

The present invention concerns the processing of semiconductor devices and pertains particularly to the removal of silicon oxynitride material using a wet chemical process after gate etch processing.

The gate patterning step is arguably the most critical step in the process flow for integrated circuits. To improve the photolithography patterning capability, a 270 Angstrom (Å) inorganic bottom anti-reflective coating (BARC) of silicon oxynitride (SiON) can be deposited beforehand. However, this SiON layer must be removed from atop the gate stack before a metal silicide can be formed. Any SiON remaining greatly hinders the uniform formation of a low sheet resistance silicide.

In the prior art, the SiON layer is removed as a part of the spacer etch. The spacer etch process etches a blanket-deposited dielectric film to form a spacer with which to separate the lightly doped drain (LDD) and source/drain regions. After the spacer is formed, an overetch is performed to remove the SiON layer. This overetch is typically performed in a dielectric etcher with gases such as CF4, CHF3, and Ar. However, this overetch results in several undesired effects: loss of silicon trench isolation oxide, undesired etching of the diffusion silicon, and recessing of the spacer.

SUMMARY OF THE INVENTION

In accordance with the preferred embodiment of the present invention, a method is presented for forming a transistor gate structure. A gate oxide layer is formed. Gate material is deposited on the gate oxide layer. A layer of silicon oxynitride is deposited on the gate material. The layer of silicon oxynitride, the gate material and the gate oxide layer are etched to form a gate structure. A silicon oxynitride layer remains on top of the gate structure. A wet chemical process is performed to remove the silicon oxynitride layer from the top of the gate structure. After performing the wet chemical process, conventional spacers are formed around the gate structure, without the need for an overetch.

In the preferred embodiment of the present invention, the gate material is amorphous silicon. Alternatively, the gate material can be polysilicon, annealed amorphous silicon or another type of gate material. The wet chemical process is, for example, a hot phosphoric acid etch or a neutral oxide etch (NOE). NOE is a solution containing ethylene glycol, ammonium fluoride, water and surfactant. The wet chemical process may be performed before or after a lightly doped drain is implanted.

Selectively removing the gatestack SiON layer by a wet strip process after gate etch (instead of as a part of spacer overetch) reduces trench oxide loss, etching of the diffusion silicon, and recess of the spacer. The wet strip process selectively etches the SiON layer, but leaves the remainder of the wafer, most importantly the gate oxide (e.g., a thermal oxide), untouched. With the SiON layer removed, the spacer dielectric is deposited directly onto the gate material. Then, with the spacer etch, the SiON overetch step can be removed, eliminating the associated undesired effects.

DESCRIPTION OF THE PREFERRED EMBODIMENT

Figure 1:
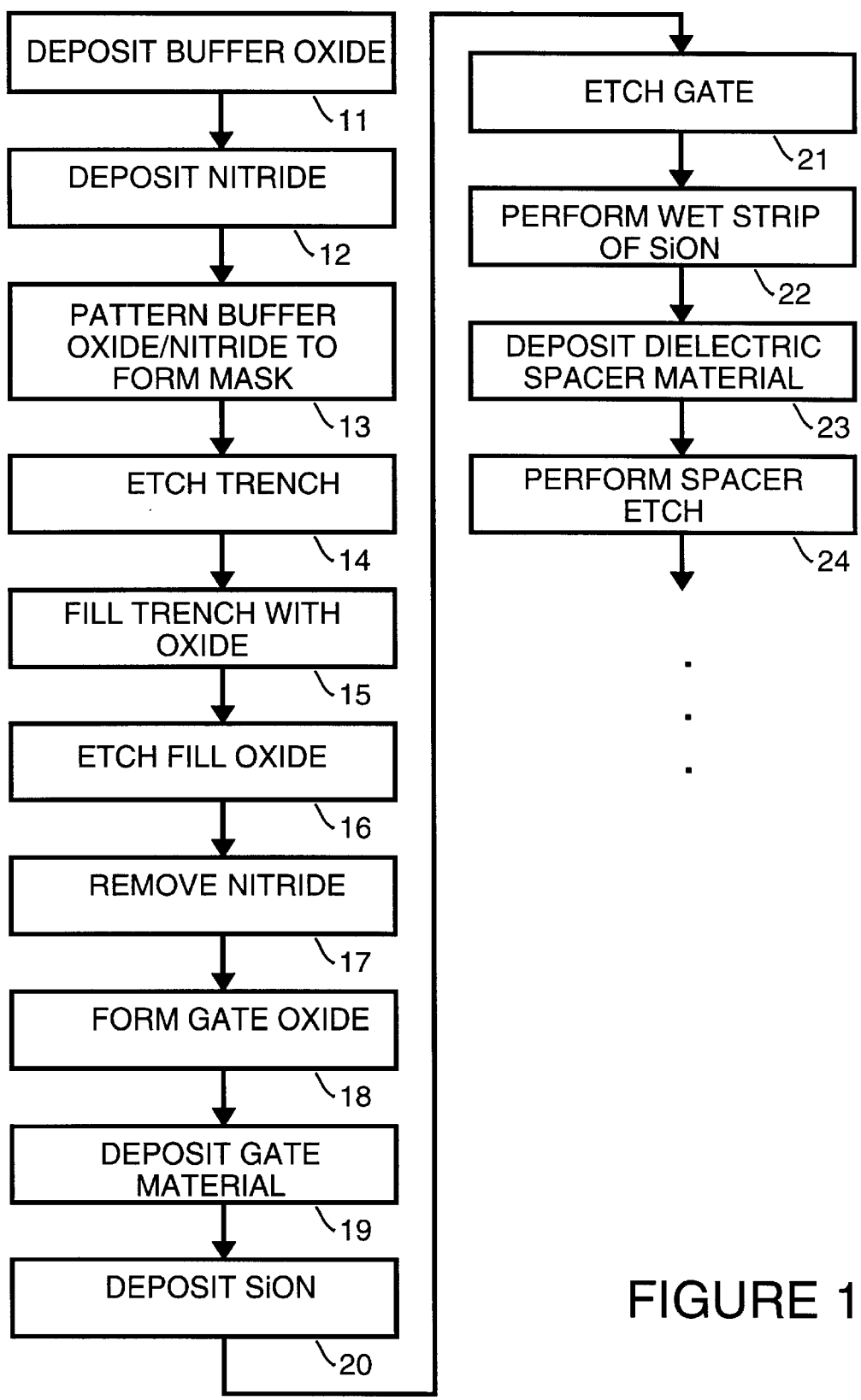
FIG. 1 is a simplified flowchart illustrating semiconductor processing in accordance with a preferred embodiment of the present invention.

FIG. 1 is a simplified flowchart for semiconductor processing in accordance with a preferred embodiment of the present invention. In a step 11, a layer of buffer (pad) oxide is formed on a substrate of a semiconductor wafer. For example, the layer of buffer oxide is formed by thermal oxidation of silicon to grow the oxide. The layer of buffer oxide is, for example, 200 Angstroms (Å) thick. In a step 12, a layer of nitride is formed on top of the layer of buffer oxide. For example, the layer of nitride is formed by low pressure chemical vapor deposition (LPCVD, $SiH_2Cl_2$+ $NH_3$· Dichlorosilane/Ammonia). The layer of nitride is, for example, 2000 Å thick. In a step 13, the nitride and buffer oxide is patterned by a dry etch process to define a trench area. The trench area is cleaned, for example, with wet chemicals such as sulfuric acid and hydrogen peroxide. The clean typically ends with a spin-rinse-dry (SRD).

Figure 2:
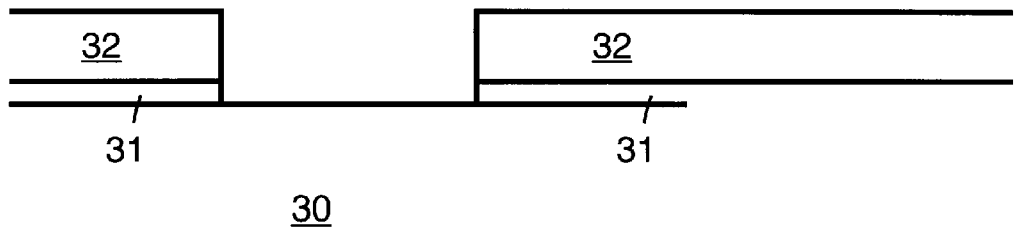
FIGS. 2, 3, 4, 5, 6, 7, 8, 9 and 10 illustrate the semiconductor processing described in FIG. 1 in accordance with a preferred embodiment of the present invention.

FIG. 2 illustrates the result of the completion of step 13. In FIG. 2, on top of a silicon substrate 30, sections 32 of a nitride layer are over sections of a buffer oxide layer 31.

Figure 3:
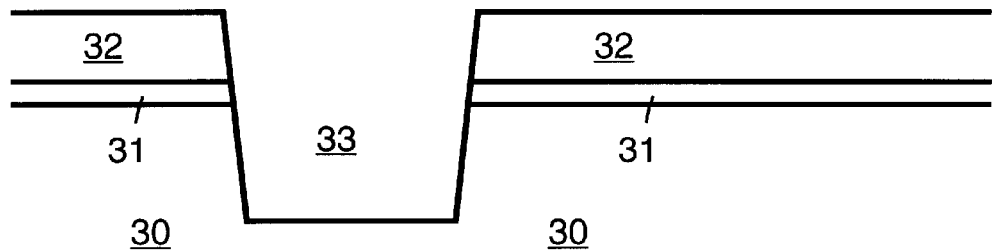

In a step 14, a trench is formed by, for example, performing a dry etch of the silicon wafer. The dry etch can be one or more steps to etch the silicon and smooth out the sidewall profile. FIG. 3 illustrates the result of the completion of step 14. In FIG. 3, a trench 33 is shown etched in silicon substrate 30. For example, trench 33 is 0.5 microns wide and extends 0.4 microns below the surface of substrate 30.

Figure 4:
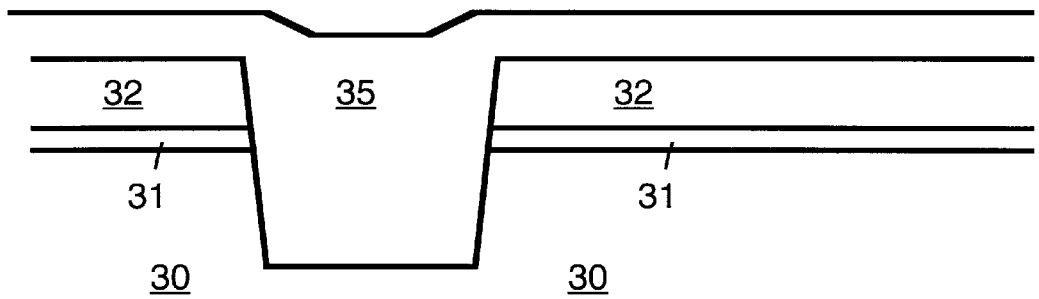

In a step 15, the trench is filled by chemical vapor deposition (CVD) with a fill oxide so that, for an average trench width, local planarization between the trench and the nitride mask is achieved. For example, the CVD oxide extends 0.7 micron above the top surface of the nitride layer. FIG. 4 illustrates the result of the completion of step 15. In FIG. 4, fill oxide 35 has filled trench 33 (shown in FIG. 3). For example, fill oxide 35 extends 0.7 microns above the top surface of the nitride layer 32.

In a step 16, the fill oxide is etched to a level just above the surface of the substrate. This etch is performed, for example, by a combination of chemical mechanical polish (CMP) process and a wet etch. The amount of fill oxide left above the surface of the substrate is such that future processing steps will remove/etch the remaining fill oxide, such that the remaining fill oxide will be aligned with, or slightly above the surface of the gate oxide.

Figure 5:
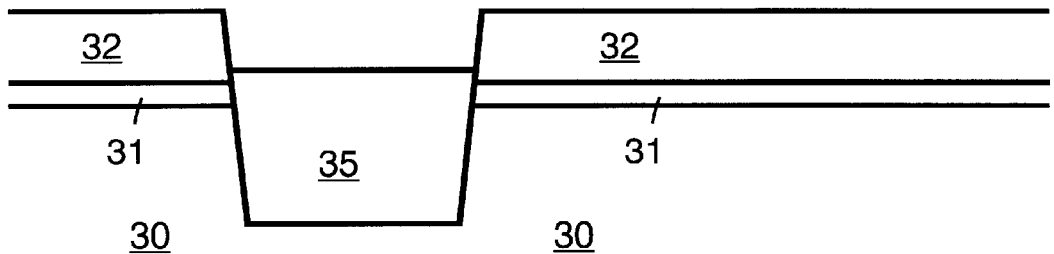

FIG. 5 illustrates the result of the completion of step 16. In FIG. 5, fill oxide 35 has been etched to a level just above the top surface of buffer oxide layer 31. For example, fill oxide 35 extends 800 Å above the top surface of the buffer layer 31.

Figure 6:
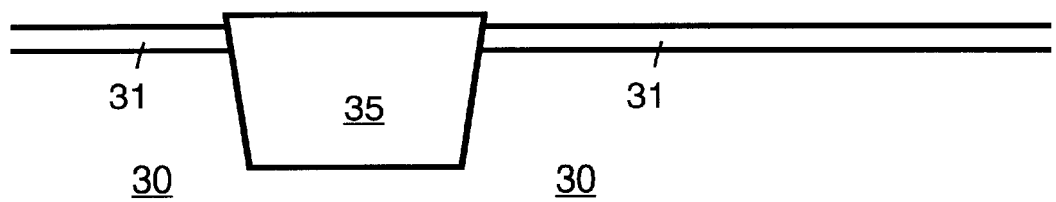

In a step 17, the nitride is stripped away, for example, by a wet etch using a "hot" phosphoric acid solution. The result is shown in FIG. 6. In FIG. 6, nitride layer 32 (shown in FIG. 5) is removed.

While shallow trench isolation (STI) has been used to form field oxide for the formation of an isolation structure other technologies may be used as well. For example, a local oxidation of silicon (LOCOS) process is often used to form field oxide regions. In a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed. However, STI has various advantages over the conventional LOCOS process. For example, STI allows for the planarization of the isolation structure. This results in better control of critical dimension (CD) when defining a gate stack of a transistor. Better control of CD when defining the gate stack results in better control of CD in further processing steps which occur after the gate stack is defined.

In a step 18, a suitable gate oxide layer is formed on the substrate, for example, by thermal growth. For example, the thickness of the gate oxide layer is about 54 Angstrom (Å). After formation of the gate oxide layer, in a step 19, an amorphous silicon layer is deposited. Alternatively, instead of amorphous silicon layer, a layer of polysilicon, a layer of annealed amorphous silicon or a layer of another type of gate material can be deposited.

In a step 20, a 270 Å inorganic bottom anti-reflective coating (BARC) of silicon oxynitride (SiON) is deposited.

Figure 7:
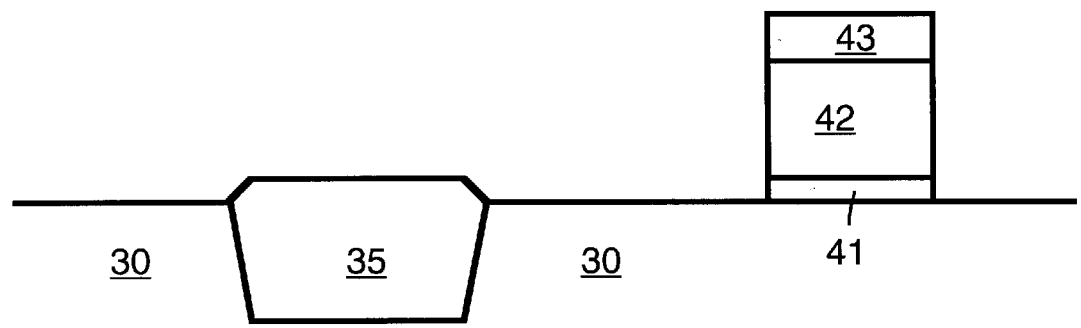

In a step 21, the polysilicon gate regions are patterned from the amorphous silicon layer and silicon dioxide layer, respectively, using standard lithographic techniques. The inorganic bottom anti-reflective coating of silicon oxynitride serves to improve the photolithography patterning capability. The result of the pattern and etch is shown in FIG. 7 where a gate stack of an oxide region 41, an amorphous polysilicon region 42 and an SiON region 43 are shown. As can be seen from FIG. 7, SiON region 43 remains on top of newly formed amorphous polysilicon (gate) region 42 with the sides of gate oxide region 41 exposed In a step 22, which occurs either before or after a conventional lightly doped drain (LDD) stage is performed and before spacers are formed, a wet chemical process is used to remove a portion, but preferably all of SiON region 43. Since wet processing is inherently isotropic, there is the potential for lateral etching of gate oxide region 41. Thus the wet strip process has to selectively etch the SiON layer, but leave gate oxide region 41 substantially unaffected.

In a preferred embodiment of the present invention, a hot phosphoric acid is used in the wet strip process. In the hot phosphoric acid process, the etch rates of SiON and thermal oxide have been measured at 59.3 Å/min for SiON and 1.62 Å/min for the thermal oxide layer. This gives a SiON-to-thermal oxide selectivity of 36.6 and a lateral loss in gate oxide region 41 of less than 10 Å with complete removal of SiON region 43.

In addition to hot phosphoric acid, many different wet chemicals are possible candidates, but should be evaluated on the basis of this selectivity. For example, a neutral oxide etch (NOE) can be used. In the NOE process, the etch rates of SiON and thermal oxide have been measured as 12.5–17 Å/min and 2.5–4.5 Å/min, respectively. The etch rates depend on the amount of moisture absorbed by the NOE bath. This indicates SiON-to-thermal oxide selectivities in the range of 2.8 to 6.8. This means by the time the entire 270 Å SiON region 43 is removed, there is a 60 Å lateral loss in gate oxide region 41.

Figure 8:
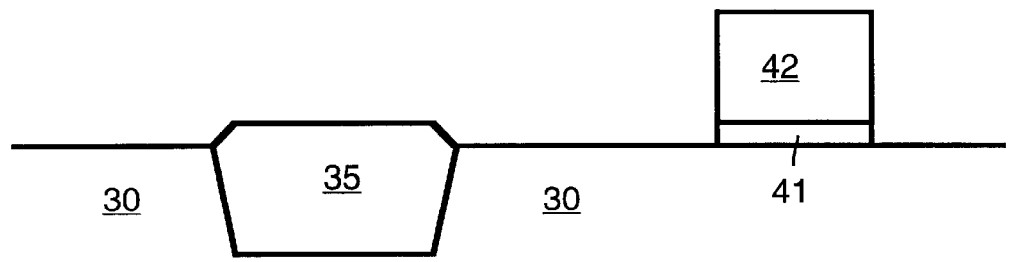

FIG. 8 shows SiON region 43 removed. After a conventional lightly doped drain (LDD) stage is performed (if it has not yet been performed), the spacers are formed.

Figure 9:
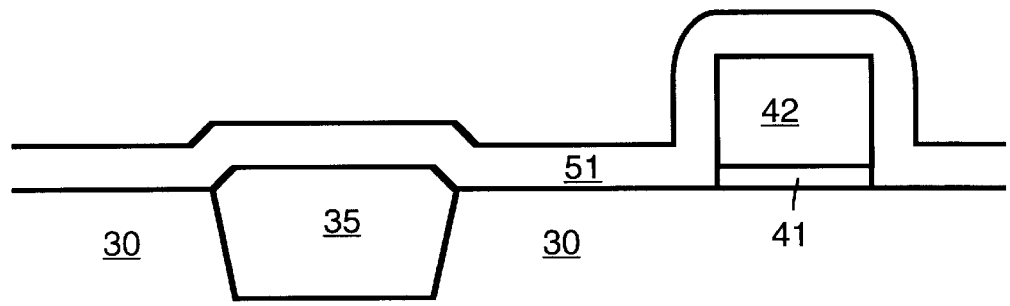

In a step 23, with SiON region 43 removed, a spacer dielectric is deposited directly on amorphous silicon region 42. For example, FIG. 9 shows a layer of spacer dielectric 51 deposited directly over amorphous silicon region 42. Layer of spacer dielectric 51 is, for example, formed of nitride or some other dielectric material.

Figure 10:
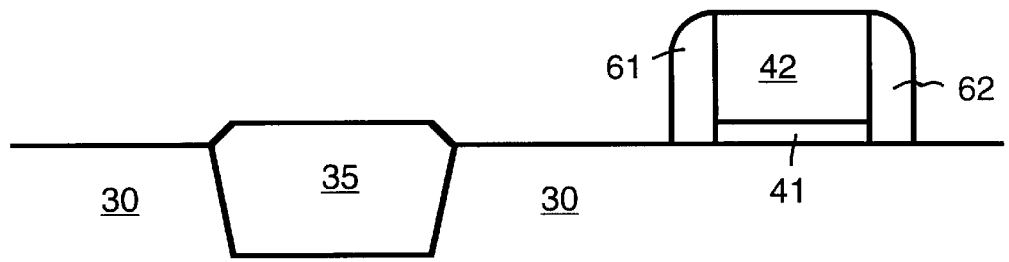

In a step 24, illustrated by FIG. 10, an etch of the spacer dielectric layer is performed to form a spacer 61 and a spacer 62.

After forming spacers 61 and 62, conventional processing continues. For example, implantation of n+ and p+ dopant is performed, for example through a screen oxide layer. The implantation is followed, for example, by a Rapid Thermal Anneal (RTA) at about 1000 degrees Celsius for about 30 seconds to activate the implanted dopants. Front-end processing also changes the crystal lattice of the amorphous silicon layer into polysilicon.

Metal silicide regions over the source/drain regions are then formed by conventional means.

While the above discussion gives an overview of processing steps, as will be understood by practitioners in the art, processing for different types of devices may vary in some details depending upon the type of process used (e.g., whether it is a CMOS or NMOS process).

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming a transistor gate structure comprising the following steps:
   (a) forming a gate oxide layer;
   (b) depositing gate material on the gate oxide layer;
   (c) depositing a layer of silicon oxynitride on the gate material;
   (d) etching the layer of silicon oxynitride, the gate material and the gate oxide layer to form a gate structure, a silicon oxynitride region remaining on top of the gate structure;
   (e) performing a wet chemical process to remove the silicon oxynitride region from the top of the gate structure, the wet chemical process removing the silicon oxynitride region by selectively etching the silicon oxynitride region; and,
   (f) after performing the wet chemical process, forming spacers around the gate structure.

2. A method as in claim 1 wherein in step (b) the gate material is amorphous silicon.

3. A method as in claim 1 wherein in step (b) the gate material is polysilicon.

4. A method as in claim 1 wherein in step (e) the wet chemical process is a hot phosphoric acid etch.

5. A method as in claim 1 wherein in step (e) the wet chemical process is a neutral oxide etch.

6. A method as in claim 1 wherein step (e) is performed before a lightly doped drain is implanted.

7. A method as in claim 1 wherein step (e) is performed after a lightly doped drain is implanted.

8. A method for forming a transistor gate structure comprising the following steps:
   (a) forming a gate structure having a gate material region on top of a gate oxide region, a silicon oxynitride region remaining on top of the gate structure;
   (b) performing a wet chemical process to remove the silicon oxynitride region from the top of the gate structure, the wet chemical process removing the silicon oxynitride region by selectively etching the silicon oxynitride region; and,
   (c) after performing the wet chemical process, forming spacers around the gate structure.

9. A method as in claim 8 wherein in step (a) the gate material is amorphous silicon.

10. A method as in claim 8 wherein in step (a) the gate material is polysilicon.

11. A method as in claim 8 wherein in step (b) the wet chemical process is a hot phosphoric acid etch.

12. A method as in claim 8 wherein in step (b) the wet chemical process is a neutral oxide etch.

13. A method as in claim 8 wherein step (b) is performed before a lightly doped drain is implanted.

14. A method as in claim 8 wherein step (b) is performed after a lightly doped drain is implanted.

15. A method for processing an integrated circuit comprising the following steps:
   (a) forming a gate oxide layer;
   (b) depositing gate material on the gate oxide layer;
   (c) depositing a layer of silicon oxynitride on the gate material;
   (d) etching the layer of silicon oxynitride, the gate material and the gate oxide layer to form a gate structure, a silicon oxynitride region remaining on top of the gate structure;
   (e) performing a wet chemical process to remove the silicon oxynitride region from the top of the gate structure, the wet chemical process removing the silicon oxynitride region by selectively etching the silicon oxynitride region; and,
   (f) after performing the wet chemical process, forming spacers around the gate structure.

16. A method as in claim 15 wherein in step (b) the gate material is amorphous silicon.

17. A method as in claim 15 wherein in step (e) the wet chemical process is a hot phosphoric acid etch.

18. A method as in claim 15 wherein in step (e) the wet chemical process is a neutral oxide etch.

19. A method as in claim 15 wherein step (e) is performed before a lightly doped drain is implanted.

20. A method as in claim 15 wherein step (e) is performed after a lightly doped drain is implanted.

* * * * *